US008427146B2

(12) United States Patent
Nagasaka

(10) Patent No.: US 8,427,146 B2
(45) Date of Patent: Apr. 23, 2013

(54) MAGNETIC SENSOR FOR MEASURING A MAGNETIC FIELD USING OPTICAL PUMPING METHOD

(75) Inventor: Kimio Nagasaka, Hokuto (JP)

(73) Assignee: Seiko Epson Corporation, Tokyo (JP)

( * ) Notice: Subject to any disclaimer, the term of this patent is extended or adjusted under 35 U.S.C. 154(b) by 442 days.

(21) Appl. No.: 12/759,849

(22) Filed: Apr. 14, 2010

(65) Prior Publication Data
US 2010/0327861 A1 Dec. 30, 2010

(30) Foreign Application Priority Data

Jun. 26, 2009 (JP) ................ 2009-152063

(51) Int. Cl.
*G01V 3/00* (2006.01)
(52) U.S. Cl.
USPC ........................................ 324/304
(58) Field of Classification Search .......... 324/300–322
See application file for complete search history.

(56) References Cited

U.S. PATENT DOCUMENTS 5,928,222 A * 7/1999 Kleinerman .................... 606/16
5,991,479 A * 11/1999 Kleinerman .................... 385/31
6,472,869 B1 * 10/2002 Upschulte et al. ............. 324/304

OTHER PUBLICATIONS

Affolderbach et al., "An all-optical, high-sensitivity magnetic gradiometer," *Applied Physics B*, vol. 75, pp. 605-612 (2002).
Bison et al., "A laser-pumped magnetometer for the mapping of human cardio-magnetic fields," *Applied Physics B*, vol. 76, pp. 325-328, (2003).

* cited by examiner

*Primary Examiner* — Dixomara Vargas
(74) *Attorney, Agent, or Firm* — Oliff & Berridge, PLC

(57) ABSTRACT

A magnetic sensor is provided that measures a magnetic field. The sensor includes a first gas, a probe light source which causes first circular polarized light to be incident on the first gas, a second gas arranged on an optical path of a second circular polarized light, an AC magnetic field generator which generates an AC magnetic field and generates magnetic resonance, a bias magnetic field generator which generates bias magnetic fields with different intensities for the first gas and the second gas and differentiates the optical transmittance of the first circular polarized light in the first gas from the optical transmittance of the second circular polarized light in the second gas, and a detector which detects a light amount of the first circular polarized light and a third circular polarized light.

4 Claims, 6 Drawing Sheets

MAGNETIC SENSOR FOR MEASURING A MAGNETIC FIELD USING OPTICAL PUMPING METHOD

BACKGROUND

1. Technical Field

The present invention relates to a magnetic sensor or the like.

2. Related Art in the related art, a biomagnetism detecting apparatus has been known that measures a minute magnetic field occurring from a living subject, such as cardiac magnetism (magnetism coming from a heart), cerebral magnetism (magnetism coming from a brain), and the like. As such a biomagnetism detecting apparatus, for example, there is a Superconducting Quantum Interference Device (SQUID). Furthermore, the SQUID is a device (magnetic sensor) that can take variations of a slight magnetic field out as an electric voltage under a low temperature environment, by using, for example, a device (Josephson device) in which a thin portion (Josephson junction) is provided in a part of a superconducting device such as a superconducting ring, or the like.

FIGS. 6A and 6B are schematic diagrams of magnetic flux detecting coils showing an example of the SQUID in the related art. FIG. 6A is a diagram showing a magnetic flux detecting coil (magnetometer), which is wound once. FIG. 6B is a diagram showing a magnetic flux detecting coil that two parallel coils wound in opposite directions to each other are connected in series (first-order gradient type gradiometer).

As shown in FIG. 6A, in a magnetometer 101, a magnetic field 110 coming into the coil is totally detected. Therefore, in order to detect only a magnetic field (for example, cardiac magnetism or cerebral magnetism) generated from near the coil, it is necessary to prepare a separate method of completely eliminating a noise by a magnetic field having the source distant from the coil (for example, external magnetic noise).

As shown in FIG. 6B, in a first-order gradient type gradiometer 102, the magnetic field 110 is detected as a difference of detection signals detected from the two coils wound in the opposite directions to each other. For this reason, the influence of the magnetic field having the source distant from the coils is negated and becomes zero between the two coils, and only the magnetic field generated from near the coils is detected. However, the SQUID costs are high because a superconducting device or a Josephson device is used. In addition, the SQUID needs an effort because it is necessary to frequently supply liquid helium or liquid nitrogen to a cooling system in order to maintain a low temperature environment.

On the other hand, there is an optically-pumped atomic magnetometer as a method of measuring a micro-magnetic field without using the SQUID. The optically-pumped atomic magnetometer is an apparatus that measures a magnetic field by detecting a magnetization state of an atom by causing an atom and a magnetic field to interact with each other using an optical pumping method (a method in which an electron spin of atoms is polarized using polarized light and the polarized atoms are detected with high sensitivity). For example, in Appl. Phys. B75, 605-612 (2002) and Appl. Phys. B76, 325-328 (2003), two laser beams having polarization directions different from each other are incident on a gas cell into which alkali metal atoms such as cesium and the like are injected, the two laser beams transmitted through the gas cell are each received with two photodetectors to detect light intensities. After that, optical signals detected by the two photodetectors are converted into electric signals to calculate a difference in intensity variations of the laser beams, and thereby measuring a micro-magnetic field excluding an influence of an external magnetic field.

However, in the Appl. Phys. B75, 605-612 (2002) and Appl. Phys. B76, 325-328 (2003), there is a case where a noise occurs when optical signals detected by the two photodetectors are converted into electric signals, and thereby causing difficulties to measure a micro-magnetic field with high accuracy. In addition, since two photodetectors are used as detectors, the structure of a magnetic sensor is complicated and the calculation also becomes complicated.

SUMMARY

An advantage of some aspects of the invention is to provide a magnetic sensor that enables the measurement of a micro-magnetic field with high accuracy and achieves a simplified structure.

According to an aspect of the invention, there is provided a magnetic sensor for measuring a magnetic field using an optical pumping method including a first gas in which a valence electron is composed of an odd number of atoms or ions, a probe light source which causes first circular polarized light to be incident on the first gas, second gas in which a valence electron arranged on an optical path of second circular polarized light that is the first circular polarized light transmitted through the first gas is composed of an odd number of atoms or ions, an AC magnetic field generator which generates an AC magnetic field in a direction intersecting with an optical axis of the first circular polarized light and the second circular polarized light for the first gas and the second gas and generates magnetic resonance, a bias magnetic field generator which generates bias magnetic fields in a direction parallel to the optical axis of the first circular polarized light and the second circular polarized light with different intensities for the first gas and the second gas and differentiates the optical transmittance of the first circular polarized light in the first gas from the optical transmittance of the second circular polarized light in the second gas, and a detector which detects a light amount of the first circular polarized light and third circular polarized light that is the second circular polarized light transmitted through the second gas.

With the configuration, by generating magnetic resonance and a gradient magnetic field to the first gas and the second gas, the optical transmittance of the circular polarized light is different in the first gas and the second gas. In addition, the light amount of the circular polarized light before/after the light is transmitted through the first gas and the second gas is detected. Accordingly, a difference between the optical transmittance of the circular polarized light in the first gas and the optical transmittance of the circular polarized light in the second gas is obtained. Then, a difference between the magnetic field applied to the first gas and the magnetic field applied to the second gas is calculated. As a result, the influence of an external magnetic field for the first gas and the influence of an external magnetic field for the second gas offset each other, and thereby, only a measuring target magnetic field applied to the first gas is measured. In other words, the calculation of a difference in optical signals is performed without converting the optical signals into electric signals as in Appl. Phys. B75, 605-612 (2002) and Appl. Phys. B76, 325-328 (2003). In addition, since two photodetectors are not used as detectors, the structure of the magnetic sensor is simple and the calculation becomes smooth. Therefore, it is possible to provide the magnetic sensor that enables the measurement of a micro-magnetic field with high accuracy and achieves a simplified structure.

Furthermore, according to the above aspect of the invention, there is provided the magnetic sensor in which the bias magnetic field generator generates a bias magnetic field so that the intensity of a bias magnetic field in the first gas is greater than that of a bias magnetic field in the second gas.

With the configuration, the optical transmittance in the first gas and the second gas is assuredly different. Therefore, it is possible to provide the magnetic sensor that assuredly enables the measurement of a micro-magnetic field with high accuracy and achieves a simplified structure.

Furthermore, according to the above aspect of the invention, there is provided the magnetic sensor in which the bias magnetic field generator may generate a bias magnetic field so that the intensity of the bias magnetic field in the second gas is greater than that of the bias magnetic field in the first gas.

With the configuration, the optical transmittance in the first gas and the second gas is assuredly different. Therefore, it is possible to provide the magnetic sensor that assuredly enables the measurement of a micro-magnetic field with high accuracy and achieves a simplified structure.

Furthermore, according to the above aspect of the invention, there is provided the magnetic sensor in which the first gas and the second gas may be injected into the same cell.

With the configuration, since the first gas and the second gas are injected into the same cell, the structure of the device is simpler than a case where the first gas and the second gas are injected into difference cells. In addition, when the first gas and the second gas are injected into difference cells, the alignments of the optical axis of the probe light and each cell have to be performed separately from each other, but when the first gas and the second gas are injected into the same cell, such alignment is completed for one time, and therefore, the setting becomes easy.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
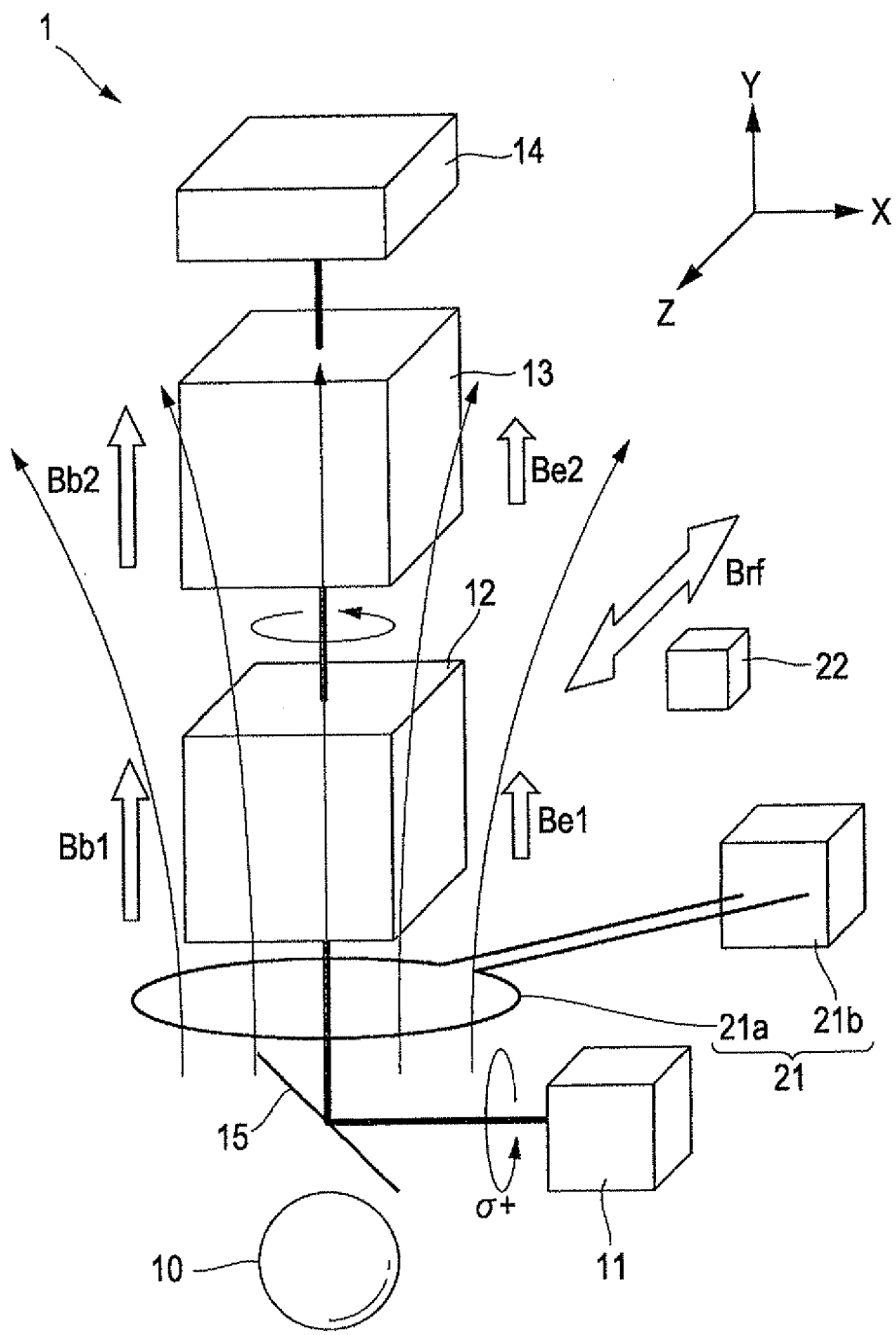
FIG. 1 is a schematic diagram showing a magnetic sensor according to an embodiment of the invention.

Hereinafter, an embodiment of the invention will be described with reference to accompanying drawings. The embodiment is to show an aspect of the invention, and the invention is not limited thereto. The invention can be arbitrarily modified within the scope of the gist of the invention. In addition, in the drawings below, the scales, the numbers, and the like of the structure are difference from those of the actual structure of the invention in order to provide easy understanding about the structure.

FIG. 1 is a schematic diagram showing the outline of the structure of a magnetic sensor 1 according to an embodiment of the invention. As shown in FIG. 1, the magnetic sensor 1 is an apparatus for measuring a measuring target magnetic field (a micro-magnetic field occurring from a magnetic field source 10, for example, cardiac magnetism or cerebral magnetism) using the optical pumping method (a method in which an electron spin of atoms is polarized using polarized light and the polarized atoms are detected with high sensitivity). In addition, in the description to be provided below, the composition and arrangement of each constituent member will be described using an XYZ orthogonal coordinate system in which the direction of the measuring target magnetic field is a Y-axis, and two directions of a plane orthogonal to the Y-axis are an X-axis and a Z-axis.

The magnetic sensor 1 includes a first cell 12, a second cell 13, a probe light source 11, an AC magnetic field generator 22, a bias magnetic generator 21, and a detector 14.

The first cell 12 and the second cell 13 are arranged together in series in the Y-axis direction. The second cell 13 is arranged on an optical path of circular polarized light that has been transmitted through a first cell 12 (second circular polarized light). The first cell 12 is arranged in a position relatively close to the magnetic field source 10, and the second cell 13 is arranged in a position relatively far from the magnetic field source 10. The first cell 12 is applied with a magnetic field Be1 that is a synthetic magnetic field of an external magnetic field and a measuring target magnetic field in the Y-axis direction. The second cell 13 is applied with a magnetic field Be2 that is a synthetic magnetic field of an external magnetic field and a measuring target magnetic field in the Y-axis direction. Here, since the second cell 13 is arranged in a position far from the magnetic field source 10, the measuring target magnetic field applied to the second cell 13 is as small as to be ignored. In other words, it is possible to regard that the second cell 13 is applied only with the external magnetic field in the Y-axis direction.

In the first cell 12 and the second cell 13, a first gas and a second gas each of which a valance electron is composed of an odd number of atoms or ions are injected. In the present embodiment, the first gas and the second gas include alkali metal atoms such as potassium, rubidium, cesium, or the like. In addition, in order to intensify the density of the alkali metal atoms in the first cell 12 and the second cell 13, the first cell 12 and the second cell 13 may be heated depending on the necessity.

Moreover, in the first cell 12 and the second cell 13, at least one gas of a rare gas such as neon, helium, argon, xenon, or the like and a non-magnetic gas such as hydrogen, nitrogen, or the like may be injected. Accordingly, it is alleviated that the alkali metal atoms injected into the first cell 12 and the second cell 13 collide with one another or with an inner wall of the cells.

The probe light source 11 is a light source that emits circular polarized light. The probe light source 11 has a function of generating spin polarization in the first gas and the second gas by causing σ+ polarized light (right circular polarized light which is clockwise circular polarized light with respect to an advancing direction of light along the Y-axis) to be incident on the first cell 12 and the second cell 13 in a direction parallel to the magnetic fields Be1 and Be2 (Y-axis direction).

Furthermore, in the embodiment, the σ+ polarized light becomes incident on the first cell 12 into which the first gas is injected and to be incident on the second cell 13 into which the second gas is injected, respectively, but is not limited thereto. For example, it does not matter that σ− polarized light (left circular polarized light which is counterclockwise circular polarized light with respect to the advancing direction of light along the Y-axis) becomes incident on the second cell 13 into which the second gas is injected and the first cell 12 into which the first gas is injected.

The magnetic sensor 1 of the embodiment adopts a longitudinal optical pumping with which the incidence direction of the σ+ polarized light (Y-axis direction) which is incident on the first cell 12 and the second cell 13 is parallel to the direction in which the magnetic fields Be1 and Be2 are applied (Y-axis direction).

The AC magnetic field generator 22 has a function of generating an AC magnetic field Brf for the first cell 12 and the second cell 13 in the Z-axis direction to cause magnetic resonance.

The bias magnetic field generator 21 includes a coil 21a and a power supply 21b. The coil 21a has the Y-axis as a central axis and is arranged in the vicinity of the first cell 12, which is between the reflective mirror 15 and the first cell 12. In addition, the bias magnetic field generator 21 is configured to apply bias magnetic fields Bb1 and Bb2 of different intensity to the first cell 12 and the second cell 13 in the Y-axis direction by generating a gradient magnetic field in the Y-axis direction with a current flowing on the coil 21a. In the embodiment, it is configured that the intensity of the bias magnetic field Bb1 in the first cell 12 is greater than that of the bias magnetic field Bb2 in the second cell 13 (Bb1>Bb2).

Furthermore, in the embodiment, the bias magnetic field generator 21 generates a bias magnetic field so that the intensity of the bias magnetic field Bb1 in the first cell 12 is greater than that of bias magnetic field Bb2 in the second cell 13, but is not limited thereto. For example, the bias magnetic field generator 21 may generate a magnetic field so that the intensity of the bias magnetic field Bb2 in the second cell 13 is greater than that of the bias magnetic field Bb1 in the first cell 12.

The detector 14 includes a light-sensitive element, for example, a photodetector. The detector 14 has a function of detecting the light amount of the first circular polarized light incident on the first cell 12 and third circular polarized light which is the second circular polarized light transmitted through the second cell 13 (light amount before/after the light is transmitted through the first cell 12 and the second cell 13). In addition, by electrically calculating a difference in light amounts with the photodetector, it is possible to measure only a micro-magnetic field occurring from the magnetic field source 10. In the embodiment, two photodetectors are not used as detectors different from Appl. Phys. B75, 605-612 (2002) and Appl. Phys. B76, 325-328 (2003).

When the σ+ polarized light is incident on the first cell 12 in the Y-axis direction, outermost electrons of the alkali metal atoms are spin-polarized. Specifically, since the σ+ polarized light in the Y-axis direction has angular momentum of $+h/2\pi$ (wherein, h is a Planck's constant), the alkali metal atoms that have absorbed the σ+ polarized light temporarily maintain the angular momentum of $+h/2\pi$ and the magnetic moment is oriented in the positive direction of the Y-axis. Here, the magnetization vector in the first cell 12 is expressed by the sum of the magnetic moments of a number of the alkali metal atoms. Since the direction of the magnetic moment of each alkali metal atom is toward almost the positive direction of the Y-axis in the first cell 12, and accordingly, the direction of the magnetization vector is toward the positive direction of the Y-axis and strong magnetization is formed in the positive direction of the Y-axis.

Figure 2A:
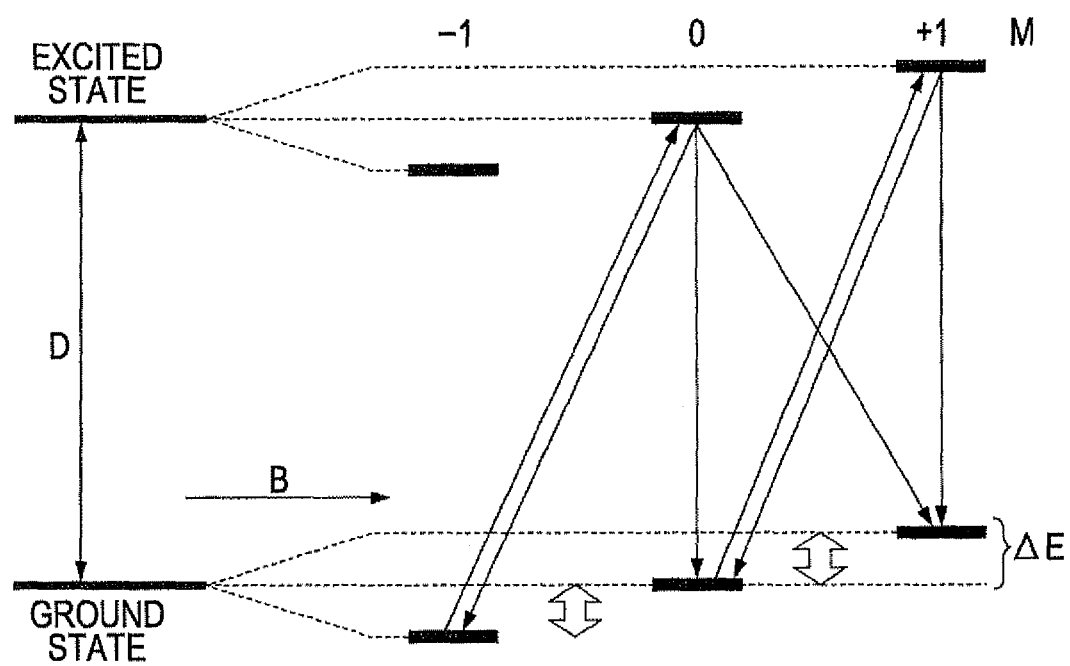
FIGS. 2A and 2B are diagrams showing the principle of optical pumping by circular polarized light.
Figure 2B:
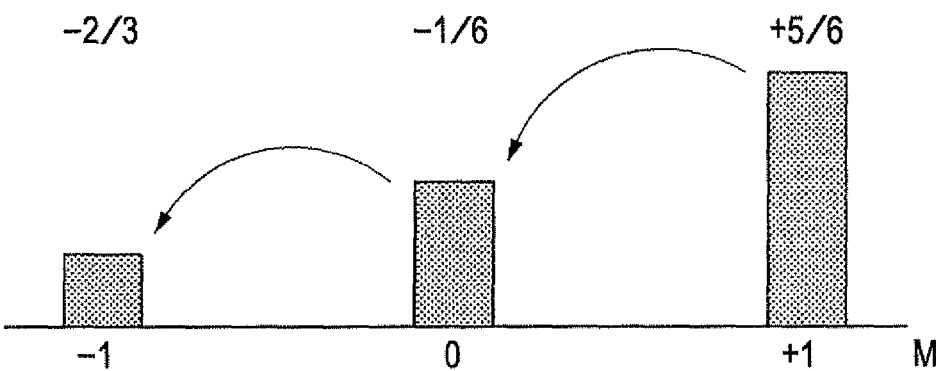

FIGS. 2A and 2B are diagrams showing the principle of optical pumping by the σ+ polarized light incident on the first cell 12. FIG. 2A is an energy level diagram in a ground state and an excited state. FIG. 2B is a diagram showing the number of atoms (population) in the ground state. In addition, ΔE in FIG. 2A is Zeeman splitting energy.

Hereinafter, a case where rubidium is used as an alkali metal atom will be described. Rubidium has a characteristic of having a large number of solid atoms in a normal temperature, but having a larger number of gaseous atoms as the temperature increases. For example, it is assumed that the inside of the first cell 12 is heated to be about 120° C. so that rubidium has a large number of gaseous atoms. Here, description will be provided about a case where a wavelength D of an absorption spectral line of the rubidium is syntonized with an absorption line from the ground state to the excited state to make atoms excited (D=797.7 nm).

As shown in FIG. 2A, when a magnetic field B is applied to the rubidium, a difference occurs in the energy level of the ground state and the excited state, and so-called Zeeman splitting occurs. The ground state and the excited state each include three Zeeman levels. What is characterized for the three Zeeman levels is a magnetic quantum number M, and M=−1, 0, +1 for each state.

When one rubidium atom absorbs σ+ polarized light of the wavelength D, the atom is excited from the ground state to be in the excited state of which the magnetic quantum number M increases by one due to the selectivity of transition. For example, an atom which has M=−1 in the ground state is excited to be M=0 in the excited state by the absorption of the σ+ polarized light. In addition, an atom which has M=0 in the ground state is excited to be M=+1 in the excited state by the absorption of the σ+ polarized light. On the other hand, an atom which has M=+1 in the ground state is not excited because there is not a level of M=+2 in the excited state. Furthermore, when σ− polarized light is given to an atom, the description above is the opposite.

The excited atom returns to the ground state by emitting light in a spontaneous emission process. It is assumed that the excited atom is in any transition to the magnetic quantum number M=−1, 0, and +1, and all the transitions have the same probability. The whole process from the excitement of the atom to the spontaneous emission is called an optical pumping cycle.

As shown in FIG. 2B, the expected value of population balance in the ground state of one optical pumping cycle is −2/3 in M=−1 of the ground state, −1/6 in M=0 of the ground state, and +5/6 in M=+1 of the ground state. Furthermore, the expected value of population balance in the ground state refers to a value obtained by summing the probability that an atom comes out of the ground state and the probability that an atom returns to the ground state.

Specifically, the expected value of the population balance in M=−1 of the ground state is a value −2/3 obtained by summing −1 which is the probability that an atom comes out of the ground state (probability to be excited to M=0 of the excited state by the excitement of the atom) and +1/3 which is the probability that an atom returns to the ground state (probability to return from M=0 of the excited state by the spontaneous emission of the atom). The expected value of the population balance in M=0 of the ground state is a value −1/6 obtained by summing −1 which is the probability that the atom comes out of the ground state (probability to be excited to M=+1 of the excited state by the excitement of the atom) and a value +5/6 which is the probability that the atom returns to the ground (the sum of +1/3 which is the probability that the atom returns from M=0 of the excited state by the spontaneous emission and +½ which is the probability that the atom returns from M=+1 of the excited state by the spontaneous emission). The expected value of the population balance in M=+1 of the ground state is a value +⅚ obtained by summing 0 which is the probability that the atom comes out of the ground state and +⅚ which is the probability that the atom returns to the ground state (the sum of +⅓ which is the probability that the atom returns from M=0 of the excited state by the spontaneous emission and +½ which is the probability that the atom returns from M=+1 of the excited state by the spontaneous emission). As such, the expected value of the population balance of the ground state tends to increase as the magnetic quantum number M in the ground state has a high level.

However, there is no actual case where all atoms are excited to be M=+1 in the excited state. The population of each Zeeman level of the ground state is in a so-called relaxation process in which atoms are in transition from a level of a large magnetic quantum number M to a level of a small magnetic quantum number M by the influence of collision of atoms or the like. For that reason, the population of each Zeeman level of the ground state is determined by an equilibrium state between the excitement of atoms by optical pumping and the spontaneous emission. The population of gaseous atoms subjected to optical pumping in the ground state has a difference between the Zeeman levels. Since atoms that contribute to the absorption of circular polarized light in a cell decreases in a level of a small magnetic quantum number M (M=−1 of the ground state) among the three Zeeman levels of the ground state, the optical transmittance of a cell increases. On the other hand, when the AC magnetic field Brf that has a frequency corresponding to the Zeeman splitting energy ΔE is generated for a cell, the atoms are in transition to a level of a small magnetic quantum number M (magnetic resonance occurs). If they are, since atoms that can contribute to the absorption of the circular polarized light inside the cell increase in the level of a small magnetic quantum number M (M=−1 of the ground state), the optical transmittance of the cell decreases.

Figure 3:
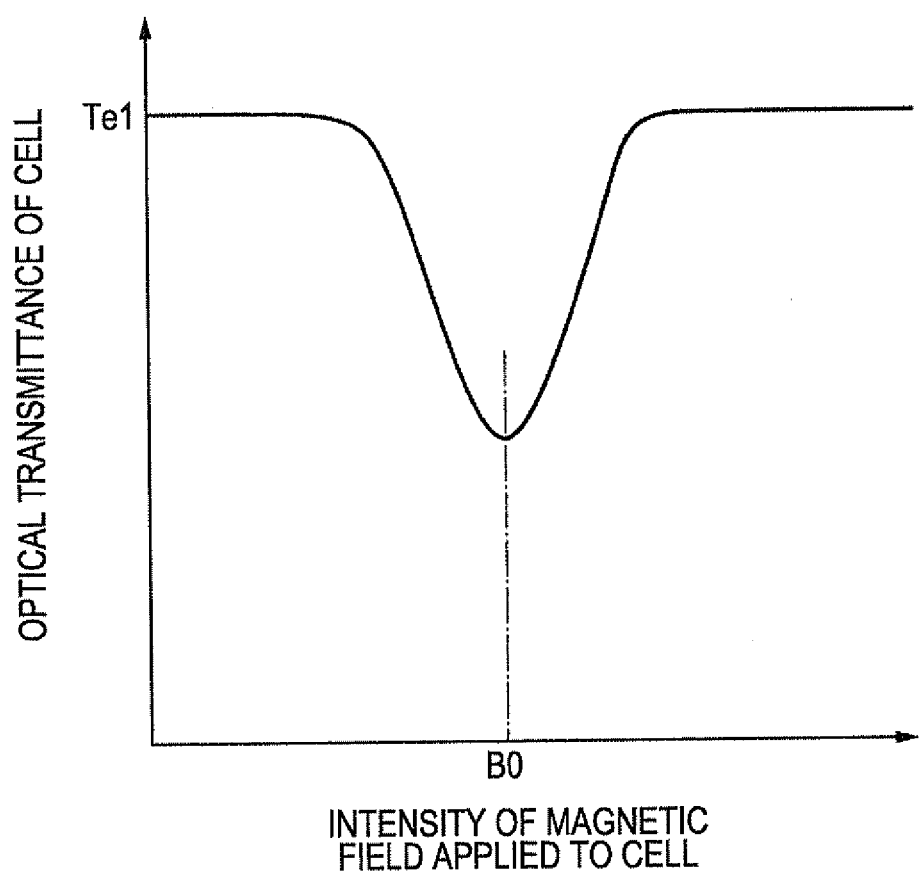
FIG. 3 is a graph showing the relationship between the intensity of a magnetic field applied to a cell and optical transmittance of a cell.

FIG. 3 is a graph showing the relationship between the intensity of a magnetic field applied to a cell and the optical transmittance of a cell. In FIG. 3, the horizontal axis shows the intensity of a magnetic field applied to a cell, and the vertical axis shows the optical transmittance of a cell. Hereinafter, a case where the angular frequency of the AC magnetic field Brf applied to the first cell 12 is fixed will be described as an example.

As shown in FIG. 3, when the intensity of the magnetic field Be1 changes in a state where the angular frequency of the AC magnetic field Brf applied to the first cell 12 is fixed, an optical transmittance Te1 of the first cell 12 changes. The optical transmittance Te1 of the first cell 12 becomes at the minimum when the intensity of the magnetic field is B0 (Be1=B0). When it is assumed that the angular frequency of the AC magnetic field Brf is W0 and a gyromagnetic ratio (a constant number) is V, and W0=V×Be1, the optical transmittance Te1 of the first cell 12 becomes the minimum.

Here, it can be considered that a gradiometer is formed by using the first cell 12 and the second cell 13. When the magnetic field Be1 applied to the first cell 12 and the magnetic field Be2 applied to the second cell 13 are the same, the changes of the optical transmittance Te1 corresponding to the intensity of the magnetic field Be1 and the optical transmittance Te2 corresponding to the intensity of the magnetic field Be2 are the same. For that reason, it is possible to detect a difference between the magnetic field Be1 applied to the first cell and the magnetic field Be2 applied to the second cell from the optical transmittance Te1×Te2 when the first cell 12 and the second cell 13 are stacked in a direction parallel to the optical axis of circular polarized light. Therefore, the magnetic sensor 1 of the embodiment causes the bias magnetic fields Bb1 and Bb1 with respectively different intensities to be generated for the first cell 12 and the second cell 13, and to shift to different magnetic resonance frequencies. Accordingly, the optical transmittance Te1 of the circular polarized light in the first cell 12 is differentiated from the optical transmittance Te2 of the circular polarized light in the second cell 13.

Specifically, a gradient magnetic field is generated in the Y-axis direction by flowing the current in the coil 21a (refer to FIG. 1), and the bias magnetic field Bb1 and Bb2 are applied to the first cell 12 and the second cell 13 respectively with different intensities in the Y-axis direction. In the embodiment, the intensity of the bias magnetic field Bb1 in the first cell 12 is greater than that of the bias magnetic field Bb2 in the second cell 13 (Bb1>Bb2).

Figure 4:
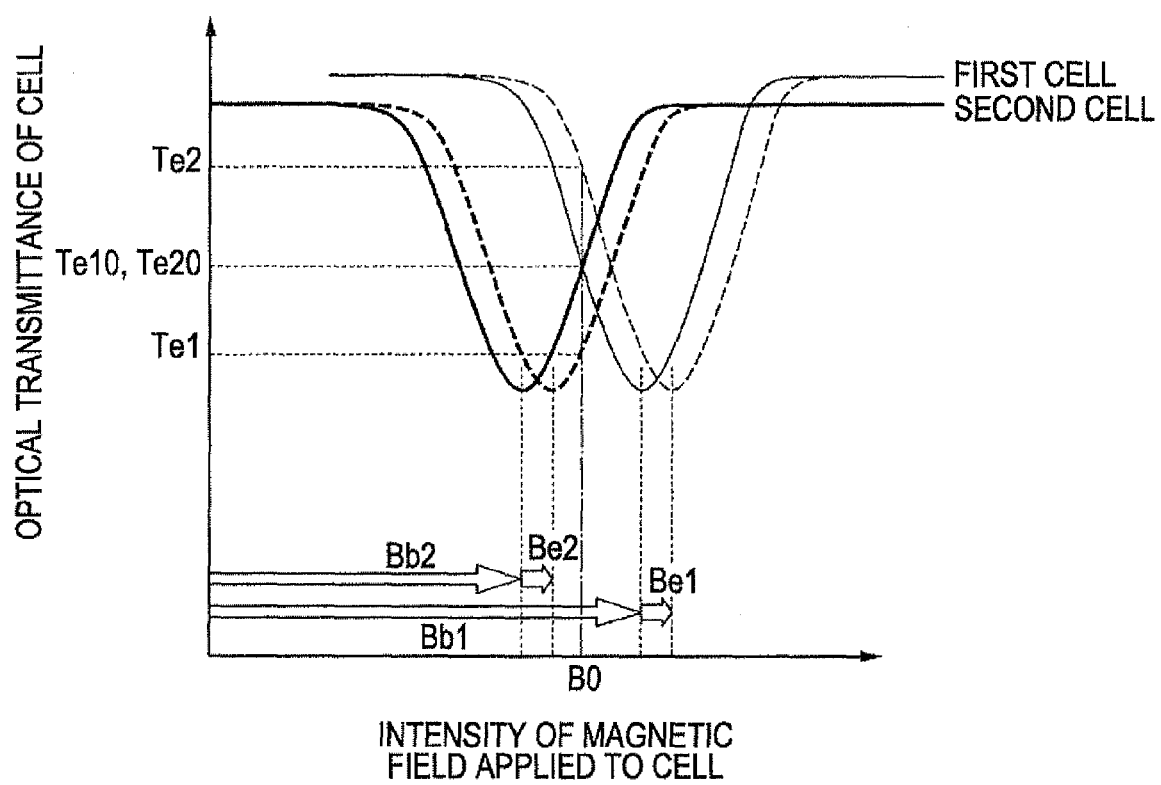
FIG. 4 is a graph showing the intensity of a magnetic field and optical transmittance of a cell in case of a common external magnetic field.

FIG. 4 is a graph showing the relationship between the intensity of a magnetic field applied to a cell and the optical transmittance of a cell in a case of a common external magnetic field. In FIG. 4, the horizontal axis shows the intensity of a magnetic field applied to a cell, and the vertical axis shows the optical transmittance of a cell. Furthermore, the case of a common external magnetic field refers to a case where an external magnetic field (an external magnetic field having the same intensity) is applied in common to the first cell 12 and the second cell 13 (Be1=Be2). However, the case is applied when there is a relationship of 0<Be1<<Bb1 and 0<Be2<<Bb2.

As shown in FIG. 4, if the intensity of the bias magnetic field Bb1 in the first cell 12 is made to be greater than that of the bias magnetic field Bb2 in the second cell 13 (Bb1>Bb2), the minimum value of the optical transmittance in the first cell 12 is placed away from the minimum value of the optical transmittance in the second cell 13. The angular frequency W0 of the AC magnetic field Brf corresponds to the magnetic field B0 which is an intersection of a curve of the optical transmittance in the first cell 12 (the thin solid line) and a curve of the optical transmittance in the second cell 13 (the thick solid line). An optical transmittance Te10 in the first cell 12 and an optical transmittance Te20 in the second cell 13 when an external magnetic field is not applied to the first cell 12 and the second cell 13 (Be1=Be2=0) have the same value (Te10=Te20). At this point, the optical transmittance when the first cell 12 and the second cell 13 are stacked in the direction parallel to the optical axis of the circular polarized light is Te10×Te20.

The total magnetic field applied to the first cell 12 is Bb1+Be1, and the magnetic resonance frequency is shifted to V (Bb1+Be1). At this point, the optical transmittance Te1 in the magnetic field B0 corresponding to the angular frequency W0 of the AC magnetic field Brf becomes smaller than the optical transmittance Te10 when the external magnetic field is not applied. On the other hand, the total magnetic field applied to the second cell 13 is Bb2+Be2, and the magnetic resonance frequency is shifted to V (Bb2+Be2). At this point, the optical transmittance Te2 in the magnetic field B0 corresponding to the angular frequency W0 of the AC magnetic field Brf becomes greater than the optical transmittance Te20 when the external magnetic field is not applied, contrary to the case of the first cell 12.

As such, from the contrary characteristic of the optical transmittance between the optical transmittance Te1 in the magnetic field B0 of the first cell 12 and the optical transmittance Te2 in the magnetic field B0 of the second cell 13, the optical transmittance Te1XTe2 of the two cells is approximately Te10XTe20. In other words, common external magnetic fields applied to the two cells are offset.

Figure 5:
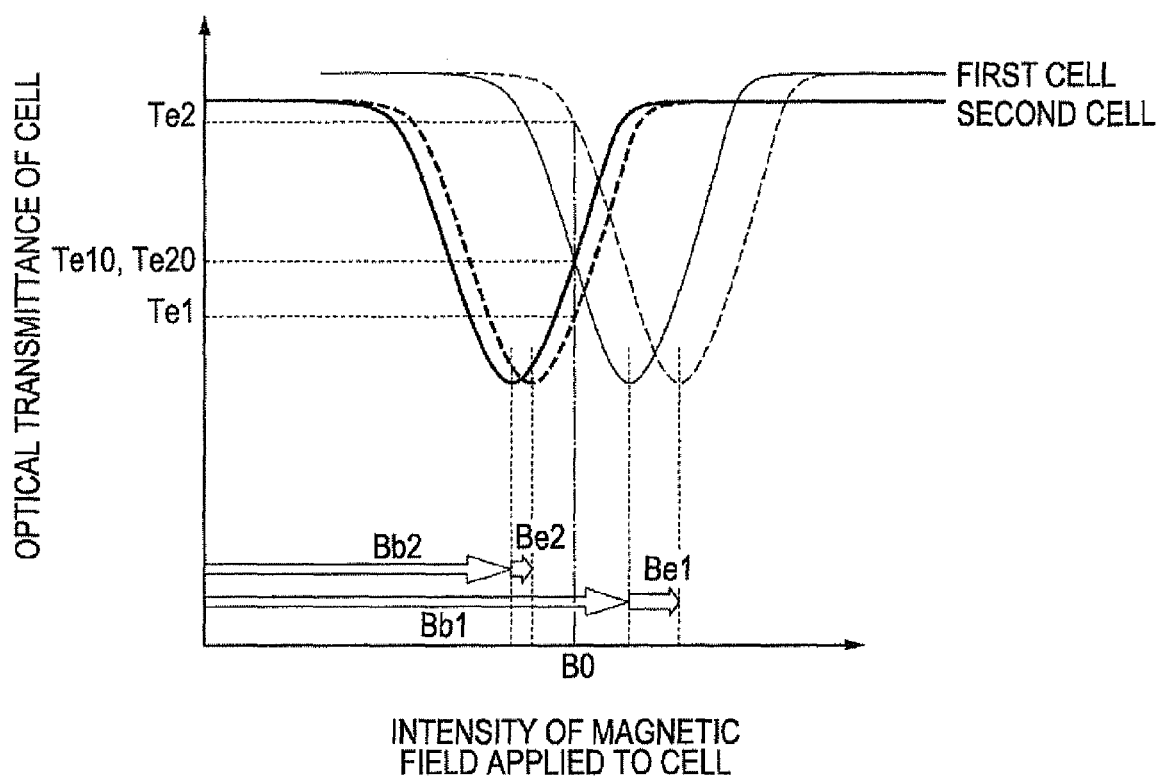
FIG. 5 is a graph showing the intensity of a magnetic field and optical transmittance of a cell in case of a non-common external magnetic field.
Figure 6A:
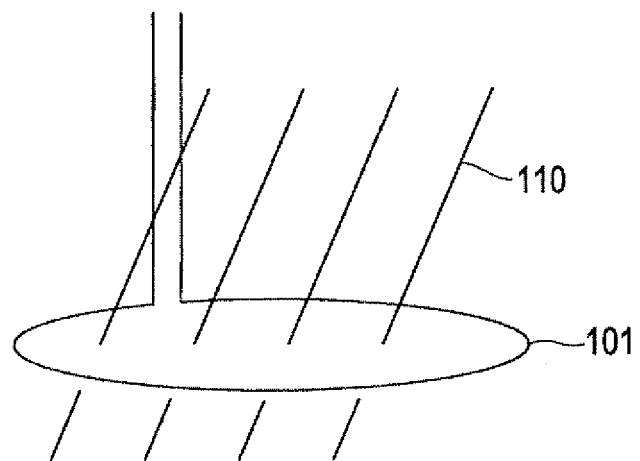
FIGS. 6A and 6B are schematic diagrams of magnetic flux coils showing an example of SQUID in the related art.
Figure 6B:
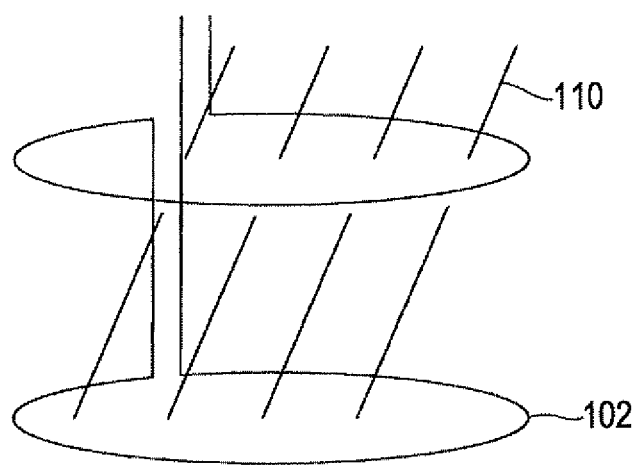

FIG. 5 is a graph showing the relationship between the intensity of the magnetic field applied to a cell and the optical transmittance of a cell in case of a non-common external magnetic field according to FIG. 4. FIG. 5 is different from FIG. 4 described above in that the former is a relationship diagram for a non-common external magnetic field and the latter is a relationship diagram for a common external magnetic field. Other points of FIG. 5 are the same as those of FIG. 4, and therefore the same reference numerals are given to the same constituent elements as FIG. 4, and the description thereof will not be repeated. Furthermore, the case of the non-common external magnetic field refers to a case where external magnetic fields (a measuring target magnetic field from the magnetic field source 10) are applied to the first cell 12 and the second cell 13 with the different intensities (Be1≠Be2). However, the case is applied when there is a relationship of Be1>Be2, 0<Be1<<Bb1 and 0<Be2<<Bb2.

As shown in FIG. 5, if the intensity of the bias magnetic field Bb1 in the first cell 12 is made to be greater than that of the bias magnetic field Bb2 in the second cell 13 (Bb1>Bb2) and a measuring target magnetic field from the magnetic field source 10 is applied thereto, the minimum value in the first cell 12 is placed remarkably away from the minimum value in the second cell 13 in comparison to the case of the common external magnetic field described above.

For the first cell 12, the optical transmittance Te1 in the magnetic field B0 corresponding to the angular frequency W0 of the AC magnetic field Brf is smaller than the optical transmittance Te10 when the external magnetic field is not applied, but the variance is smaller than that in the case of the common external magnetic field described above. On the other hand, for the second cell 13, the optical transmittance Te2 in the magnetic field B0 corresponding to the angular frequency W0 of the AC magnetic field Brf is greater than the optical transmittance Te20 when the external magnetic field is not applied, but the variance is greater than that in the case of the common external magnetic field described above.

From the characteristic of the optical transmittance of the optical transmittance Te1 in the magnetic field B0 of the first cell 12 and the optical transmittance Te2 in the magnetic field B0 of the second cell 13, which have different variances in comparison to the case of the common external magnetic field as described above, the optical transmittance of the two cells of Te1XTe2 is greater than Te10XTe20 (Te1XTe2>Te10XTe20).

For that reason, by detecting the light amount of the circular polarized light after the light is transmitted through the second cell 13 by the detector 14, it is possible to obtain a difference between the optical transmittance in the first cell 12 and the optical transmittance in the second cell 13. It is also possible to obtain a difference between the magnetic field Be1 applied to the first cell 12 and the magnetic field Be2 applied to the second cell 13 (Be1−Be2). In the embodiment, the calculation of a difference in optical signals is performed without converting the optical signals into electric signals as shown in Appl. Phys. B75, 605-612 (2002) and Appl. Phys. B76, 325-328 (2003). Therefore, the external magnetic field applied to the first cell 12 and the external magnetic field applied to the second cell 13 offset each other, and as a result, a measuring target magnetic field applied to the first cell 12 can be obtained.

According to the magnetic sensor 1 of the embodiment, by generating magnetic resonance and a gradient magnetic field to the first cell 12 and the second cell 13, the optical transmittance of circular polarized light in the first cell 12 and the second cell 13 are different. In addition, the light amount of circular polarized light before/after the light is transmitted through the first cell 12 and the second cell 13 is detected. Accordingly, it is possible to obtain a difference between the optical transmittance of the circular polarized light in the first cell 12 and the optical transmittance of the circular polarized light in the second cell 13. Then, a difference between the magnetic field Be1 applied to the first cell 12 and the magnetic field Be2 applied to the second cell 13 (Be1−Be2) is calculated. As a result, the influence of the external magnetic field applied to the first cell 12 and the influence of the external magnetic field applied to the second cell 13 offset each other, and only the measuring target magnetic field applied to the first cell 12 is measured. In other words, the calculation of a difference in optical signals is performed without converting the optical signals into electric signals as shown in Appl. Phys. B75, 605-612 (2002) and Appl. Phys. B76, 325-328 (2003). In addition, since two photodetectors are not used as detectors, the structure of the magnetic sensor 1 is simplified and the calculation becomes smooth. Therefore, it is possible to provide the magnetic sensor 1 that enables the measurement of a micro-magnetic field with high accuracy and achieves a simplified structure.

Furthermore, the magnetic sensor 1 of the embodiment is composed of two cells one of which is the first cell 12 into which the first gas is injected and the other one of which is the second cell 13 into which the second gas is injected, but is not limited thereto. For example, the first gas and the second gas may be injected into the same cell.

According to the configuration, since the first gas and the second gas are injected into the same cell, it is possible to provide the magnetic sensor 1 that enables the measurement of a micro-magnetic field with high accuracy and achieves a remarkably simplified structure.

In addition, in the magnetic sensor 1 of the embodiment, the probe light source 11 causes the σ+ polarized light to be incident on the first cell 12 in the Y-axis direction, but is not limited thereto. For example, the probe light source 11 may cause the σ− polarized light to be incident on the first cell 12 in the Y-axis direction. In other words, the probe light source 11 may cause spin polarization to be generated in the first gas and the second gas by causing the circular polarized light to be incident on the first cell 12 and the second cell 13 so that the magnetization in a direction parallel to the optical axis of the circular polarized light given to the first gas in the first cell 12 and the magnetization in a direction parallel to the optical axis of the circular polarized light given to the second gas in the second cell 13 have opposite orientations to each other.

What is claimed is:

1. A magnetic sensor for measuring a magnetic field using an optical pumping method, comprising:
   a first gas in which a valence electron is composed of an odd number of atoms or ions;
   a probe light source which causes first circular polarized light to be incident on the first gas;
   a second gas in which a valence electron arranged on an optical path of second circular polarized light that is the first circular polarized light transmitted through the first gas is composed of an odd number of atoms or ions;
   an AC magnetic field generator which generates an AC magnetic field in a direction intersecting with an optical axis of the first circular polarized light and the second circular polarized light for the first gas and the second gas and generates magnetic resonance;
   a bias magnetic field generator which generates bias magnetic fields in a direction parallel to the optical axis of the first circular polarized light and the second circular polarized light with different intensities for the first gas and the second gas and differentiates the optical transmittance of the first circular polarized light in the first gas from the optical transmittance of the second circular polarized light in the second gas; and a detector which detects a light amount of the first circular polarized light and third circular polarized light that is the second circular polarized light transmitted through the second gas, the magnetic field being measured by calculating a difference in light amount with the detector between the first circular polarized light and the third circular polarized light.

2. The magnetic sensor according to claim 1, wherein the bias magnetic field generator generates a bias magnetic field so that the intensity of a bias magnetic field in the first gas is greater than that of a bias magnetic field in the second gas.

3. The magnetic sensor according to claim 1, wherein the bias magnetic field generator generates a bias magnetic field so that the intensity of the bias magnetic field in the second gas is greater than that of the bias magnetic field in the first gas.

4. The magnetic sensor according to claim 1, wherein the first gas and the second gas are injected in the same cell.

\* \* \* \* \*